United States Patent
Seo et al.

(10) Patent No.: US 9,585,258 B2
(45) Date of Patent: Feb. 28, 2017

(54) METHOD AND DEVICE OF MANUFACTURING PRINTED CIRCUIT BOARD HAVING A SOLID COMPONENT

(71) Applicant: LG INNOTEK CO., LTD., Seoul (KR)

(72) Inventors: Yeong Uk Seo, Seoul (KR); Ki Do Chun, Seoul (KR); Chang Woo Yoo, Seoul (KR); Hyun Seok Seo, Seoul (KR); Byeong Ho Kim, Seoul (KR); Sang Myung Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 19 days.

(21) Appl. No.: 14/365,540

(22) PCT Filed: Dec. 12, 2012

(86) PCT No.: PCT/KR2012/010768
§ 371 (c)(1),
(2) Date: Jun. 13, 2014

(87) PCT Pub. No.: WO2013/089419
PCT Pub. Date: Jun. 20, 2013

(65) Prior Publication Data
US 2014/0345913 A1   Nov. 27, 2014

(30) Foreign Application Priority Data

Dec. 15, 2011  (KR) .................. 10-2011-0135963

(51) Int. Cl.
*H05K 1/03* (2006.01)
*H05K 3/06* (2006.01)
(Continued)

(52) U.S. Cl.
CPC .......... *H05K 3/067* (2013.01); *H05K 1/0298* (2013.01); *H05K 1/03* (2013.01); *H05K 1/0373* (2013.01);
(Continued)

(58) Field of Classification Search
CPC ........ H05K 3/067; H05K 1/0298; H05K 1/03; H05K 3/0026
(Continued)

(56) References Cited

U.S. PATENT DOCUMENTS

| 4,134,848 A * | 1/1979 | Adicoff | C08K 9/06 |
| | | | 428/313.9 |
| 4,661,301 A * | 4/1987 | Okada | B32B 27/12 |
| | | | 156/228 |
| 5,670,250 A * | 9/1997 | Sanville, Jr. | B29C 70/025 |
| | | | 174/256 |
| 2009/0308645 A1* | 12/2009 | Lee | H05K 3/107 |
| | | | 174/257 |
| 2010/0015404 A1* | 1/2010 | Paul | H05K 1/0373 |
| | | | 428/172 |
| 2010/0264549 A1* | 10/2010 | Ko | H01L 21/4846 |
| | | | 257/774 |

(Continued)

FOREIGN PATENT DOCUMENTS

JP   06-053632    *  2/1994
JP   2009-117438 A    5/2009
(Continued)

OTHER PUBLICATIONS

International Search Report in International Application No. PCT/KR2012/010768, filed Dec. 12, 2012.

*Primary Examiner* — Timothy Thompson
*Assistant Examiner* — Michael F McAllister
(74) *Attorney, Agent, or Firm* — Saliwanchik, Lloyd & Eisenschenk

(57) ABSTRACT

Provided is a method of manufacturing a printed circuit board, the method including: preparing an insulating substrate including a resin material in which a solid component is impregnated; forming a circuit pattern groove on the resin material by etching an upper surface of the insulating substrate; forming a plated layer in which the circuit pattern groove is buried; and forming a buried circuit pattern by removing the plated layer until the insulating layer is exposed, wherein the solid component has a diameter of less than 5% to a width of the buried circuit pattern. Thus, as a filler of a predetermined size or less is applied into the insulating layer for forming the circuit pattern, the occurrence of a void due to separation of the filler from a boundary part with the circuit pattern can be reduced, and reliability can be also secured.

8 Claims, 3 Drawing Sheets

(51) Int. Cl.
*H05K 3/46* (2006.01)
*H05K 1/02* (2006.01)
*H05K 3/00* (2006.01)
H05K 3/38 (2006.01)
H05K 3/22 (2006.01)
H05K 3/10 (2006.01)

(52) U.S. Cl.
CPC ........... *H05K 3/0026* (2013.01); *H05K 3/465* (2013.01); *H05K 1/0366* (2013.01); *H05K 3/06* (2013.01); *H05K 2201/0376* (2013.01); *H05K 2201/09036* (2013.01); *H05K 2203/0353* (2013.01); *Y10T 29/49156* (2015.01)

(58) Field of Classification Search
USPC ........................................................ 174/258
See application file for complete search history.

(56) References Cited

U.S. PATENT DOCUMENTS

2011/0232943 A1* 9/2011 Hida ...................... H05K 3/465
174/251

FOREIGN PATENT DOCUMENTS

| JP | 2011-100797 | * | 5/2011 |
| JP | 2011-100797 | A | 5/2011 |
| KR | 10-2002-0040091 | A | 5/2002 |
| KR | 10-0890447 | B1 | 3/2009 |
| KR | 10-2011-0042977 | A | 4/2011 |

* cited by examiner (a)

(b)

HAVE DEFECTIVE SIZE OF ABOUT 3μm

400

METHOD AND DEVICE OF MANUFACTURING PRINTED CIRCUIT BOARD HAVING A SOLID COMPONENT

CROSS-REFERENCE TO RELATED APPLICATIONS

This application is the U.S. national stage application of International Patent Application No. PCT/KR2012/010768, filed Dec. 12,2012, which claims priority to Korean Application No. 10-2011-0135963, filed Dec. 15, 2011, the disclosures of each of which are incorporated herein by reference in their entirety.

TECHNICAL FIELD

The present invention relates to a method and a device of manufacturing a printed circuit board.

BACKGROUND ART

A printed circuit board (PCB) is formed by printing a circuit line pattern on an electric insulating substrate with a conductive material such as Cu, and is called a board just before electronic components are mounted. That is, the printed circuit board means a circuit board which is configured such that to closely mount many kinds of electronic devices on a flat board, positions for mounting each component are determined, and a circuit pattern for connecting the components is printed on and is fixed to a surface of the flat board.

Meanwhile, to cope with the recent trend of high performance and small-sized electronic components, a buried pattern capable of making a surface of the board even at the same time as reducing a thickness of the printed circuit board has been used.

FIG. 1 illustrates a general buried-type printed circuit board.

As shown in FIG. 1, a buried-type printed circuit board 10 is configured such that a buried pattern groove 2 is formed on a surface of an insulating substrate 1, and a circuit pattern 3 is formed by burying the buried pattern groove 2 using plating.

In the printed circuit board 10 on which the buried pattern 3 is formed, due to a formation structure of the base circuit pattern and a contact part, a bonding force with an insulating member becomes very high, and pitches of the base circuit pattern and the contact part are uniformly and minutely formed.

However, in the case of forming the buried circuit pattern 3 using plating, a difference in plating between an area, in which the pattern groove 2 is formed, and the rest of the area is generated. Thus, upon etching after plating, the etching is not uniformly performed. Accordingly, like FIG. 1, since the etching is not performed at one area of the circuit pattern 3, a short between the adjacent circuit patterns occurs, and since the etching is excessively performed at another area, an error in signal transmission occurs.

DISCLOSURE OF INVENTION

Technical Problem

An aspect of the present invention provides a new method of manufacturing a buried circuit pattern.

Another aspect of the present invention provides a printed circuit board to which an insulating material for improving reliability is applied to form a buried circuit pattern.

Solution to Problem

According to an aspect of the present invention, there is provided a method of manufacturing a printed circuit board, including: preparing an insulating substrate including a resin material in which a solid component is impregnated; forming a circuit pattern groove on the resin material by etching an upper surface of the insulating substrate; forming a plated layer in which the circuit pattern groove is buried; and forming a buried circuit pattern by removing the plated layer until the insulating layer is exposed, wherein the solid component has a diameter of less than 5% to a width of the buried circuit pattern.

Advantageous Effects of Invention

According to the present invention, the circuit pattern is formed by burying the groove of the substrate using plating, and the plated layer of an upper part of the insulating layer is removed using a chemical and physical etching process, thereby enabling the buried circuit pattern to be simply and minutely formed.

Also, by using the chemical and physical etching process, the etching process can be performed without the occurrence of a short between adjacent circuit patterns until the insulating layer is exposed.

Also, because a filler having a predetermined size or less is applied into the insulating layer for the circuit pattern, the occurrence of a void due to separation of the filler from a boundary part with the circuit pattern can be reduced and reliability can be also secured.

BRIEF DESCRIPTION OF DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

MODE FOR THE INVENTION

Hereinafter, preferred embodiments of the present invention will be described in detail with reference to the accompanying drawings in such a manner that the present could be easily implemented by those having ordinary skill in the art to which the present invent pertains. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The terminology used herein is for the purpose of describing particular embodiments only and is not intended to be limiting of example embodiments.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

To clearly explain the present invention, the parts which have no relation with the explanation are omitted, and to clearly express various layers and areas, their thicknesses are enlarged. Also, like numbers may refer to like elements throughout the description of the figures.

When it is mentioned that a part such as a layer, a film, an area, a plate and the like is "above" other part, this includes a case in which the part is just above the other part as well as a case in which still another part is in their middle. On the contrary, when it is mentioned that a part is just above other part, this means that there is no still another part in their middle.

With respect to a printed circuit board in which a circuit pattern is formed in a buried type, the present invention provides a method of controlling a size of a sold component of an insulating layer on which the circuit pattern is formed.

Hereinafter, a printed circuit board according to one exemplary embodiment will be explained with reference to FIG. 2 through FIG. 10.

Figure 1:
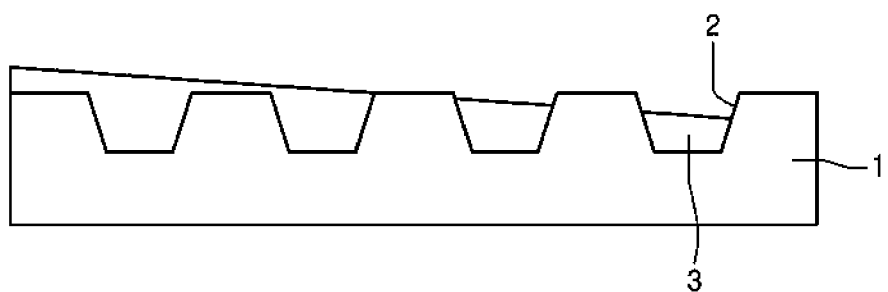
FIG. 1 is a cross-sectional view of a printed circuit board according to a conventional art.
Figure 2:
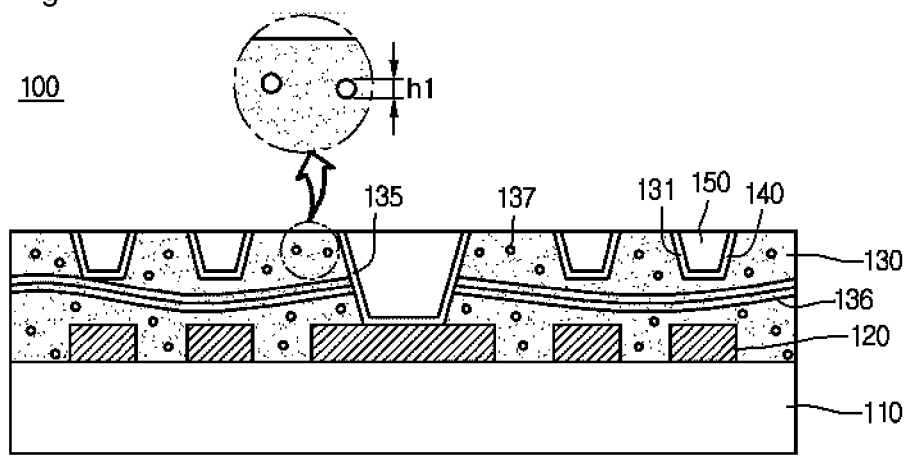
FIG. 2 is a cross-sectional view of a printed circuit board according to one exemplary embodiment of the present invention.

FIG. 2 is a cross-sectional view of a printed circuit board according to one exemplary embodiment of the present invention.

Referring to FIG. 2, a printed circuit board 100 according to one exemplary embodiment of the present invention includes: an insulating plate 110; a first circuit pattern 120 formed on the insulating plate 110; an insulating layer 130; and a plurality of second circuit patterns 150.

The insulating plate 110 may be a thermosetting or thermoplastic polymer substrate, a ceramic substrate, a substrate of an organic-inorganic composite material, or a glass fiber-impregnated substrate. When the insulating plate 110 includes a polymer resin, it may include an epoxy-based insulating resin, or a polyimide-based resin.

As a base circuit pattern, the plurality of first circuit patterns 120 are formed on the insulating plate 110.

The first circuit pattern 120 may be formed of a material having high electric conductivity and low resistance, and may be also formed by patterning a copper foil layer, which is a thin copper layer, as a conductive layer. When the first circuit pattern 120 is the copper foil layer, and the insulating plate 110 includes resins, the first circuit pattern 120 and the insulating plate 110 may be a normal copper clad laminate CCL.

Meanwhile, the insulating layer 130 is formed on the insulating plate 110 to bury the first circuit pattern 120.

The insulating layer 130 may be formed in the plurality of insulating layers 130.

The insulating layer 130 may be configured such that a solid component 130a is impregnated in a resin material, and the resin material may include an epoxy resin or a polyimide-based resin.

The solid components 136, 137 may be reinforced fiber, glass fiber or a filler 137 and so on, preferably, a mixture in which the glass fiber 136 and the filler 137 are mixed.

At this time, the solid components 136, 137 may reduce contraction and expansion of the resin material caused by heat, and increase intensity of the insulating layer 130.

At this time, the filler 137 may be an inorganic filler 137 and an inorganic substance such as $SiO_2$, $Al_2O_3$ and the like.

A size of the filler 137 of the solid components 136, 137 may be formed so that a diameter h1 satisfies less than 5% to a width of the circuit pattern 150. When a width of the second circuit pattern 150 is 3 to 25 µm, the filler 137 may have a width of 0.15 to 0.75 µm, preferably, 0.15 to 0.4 µm.

The insulating layer 130 includes: a via hole 135 to which the first circuit pattern is exposed; and a circuit pattern groove 131 for forming the plurality of second circuit patterns 150.

At this time, the circuit pattern groove 131 is formed so that a cross section thereof has a slant. Preferably, the cross-section is formed so that its width becomes narrow gradually toward the bottom.

The circuit pattern groove 131 may range from 3 to 25 µm in pattern width and 3 to 25 µm in pattern depth. Furthermore, an intaglio of the via hole 135 may satisfy about less than 80 µm in diameter, and about less than 100 µm in depth.

When the pattern depth of the circuit pattern groove 131 is less than 10 µm, the circuit pattern groove 131 may have the cross-section in a V shape.

In an inner part of the circuit pattern groove 131 and the plurality of via holes 135 of the insulating layer 130, a metal layer 140 is formed along a U shape of the circuit pattern groove 131.

The metal layer 140 is a seed layer. The metal layer may be formed of Cu, Ni or an alloy thereof.

The second circuit patterns 150 and a via 151 in which the circuit pattern groove 131 and the via holes 135 are buried, respectively, are formed on the metal layer 140.

The second circuit patterns 150 and the via 151 may be simultaneously formed and may be formed of an alloy including at least one of Al, Cu, Ag, Pt, Ni and Pd, and by plating the metal layer 140 as the seed layer.

Hereinafter, a method of manufacturing the printed circuit board 100 of FIG. 2 will be explained with reference to FIG. 3 through FIG. 10.

Figure 3:
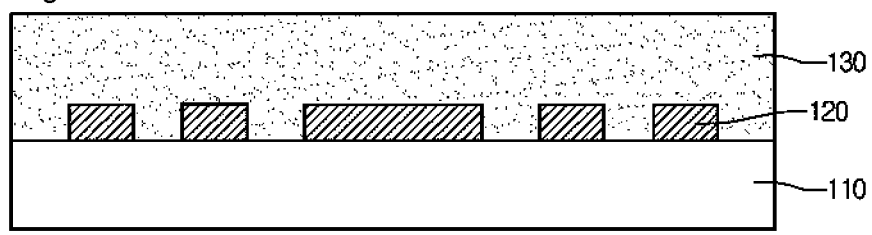
FIG. 3 through FIG. 8 are each cross-sectional view showing a method of manufacturing a printed circuit board of the present invention.

First, like FIG. 3, the first circuit pattern 120 is formed on the insulating plate 110.

The configurations of the insulating plate 110 and the first circuit pattern 120 may be formed by etching the copper foil layer of the CCL according to a design of the first circuit pattern 120. Unlike this, they may be also formed by laminating the copper foil layer on a ceramic substrate and thereafter etching it.

At this time, the first circuit pattern 120 may also include a pattern connected to the second circuit patterns 150 through the via hole 135 as shown in FIG. 2.

Next, an insulating substrate is prepared by forming the insulating layer 130 on the insulating plate 110 so as to cover the first circuit pattern 120.

The insulating layer 130 may be formed by applying a thermosetting resin and a half-hardened resin, which is not completely hardened, to the insulating plate 110 in a predetermined thickness, and by applying heat and pressure thereto so as to be hardened. Furthermore, the insulating layer 130 may be also formed as a plurality of layers.

The insulating layer 130 may be configured such that the solid component 130a is impregnated in the resin material, and the resin material may include an epoxy resin or a polyimide-based resin.

The solid components 136, 137 may be reinforced fiber, glass fiber or a filler 137 and so on, and preferably, may be a mixture in which the glass fiber 136 and the filler 137 are mixed.

A size of the filler 137 of the solid components 136, 137 may be formed so that a diameter h1 satisfies less than 5% to a width of the circuit pattern 150. When a width of the second circuit pattern 150 is 3 to 25 μm, the filler 137 may have a width of 0.15 to 0.75 μm, preferably, 0.15 to 0.4 μm.

Figure 4:
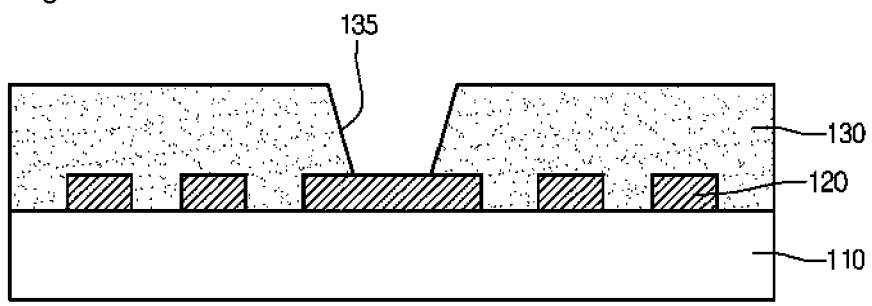

Next, as shown in FIG. 4, the via hole 135 to which the first circuit pattern 120 is exposed is formed in the insulating layer 130. The via hole 135 may be formed to have a side surface which is inclined at a predetermined angle to a plane of the substrate as shown in FIG. 4. Unlike this, the via hole 135 may be also formed to have a side surface which is vertical to the plane of the substrate.

The via hole 135 may be formed using a laser. At this time, the laser may use a UV laser or a $CO_2$ laser.

Figure 5:
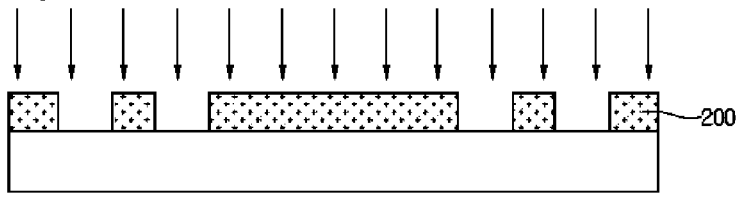

Also, the via hole 135 may be formed by a physical method, namely, a drill process, or may be also formed by selectively etching it with a chemical method Next, as shown in FIG. 5, the circuit pattern groove 131 for forming the second circuit patterns 150 is formed in the insulating layer 130. In the case of FIG. 5, the circuit pattern groove 131 may be formed using an excimer laser for emitting a laser beam having a wavelength of an ultraviolet area. A KrF excimer laser (i.e. krypton fluoride laser having a center wavelength of 248 nm), or an ArF excimer laser (i.e. argon fluoride laser having a center wavelength of 193 nm) and the like may be applied to the excimer laser.

In a case where the circuit pattern groove 131 is formed using the excimer laser, the circuit pattern groove 131 may be formed by forming a pattern mask 200 for simultaneously forming the circuit pattern groove 131, and selectively irradiating the excimer laser through the pattern mask 200.

As shown in FIG. 5, in the case where the circuit pattern groove 131 is formed through the pattern mask 200 using the excimer laser, a cross-section of the circuit pattern groove 131 is formed to have an edge in a trapezoidal shape or a rectangular shape as shown in FIG. 5.

At this time, a region in which the via hole 135 is formed forms a groove having a larger area than an exposed upper surface of the via hole 135 so that the via hole 135 may have a layered structure.

In a case where the via hole 135 is formed in the layered structure, the extended upper surface of the via hole 135 may be used as a pad for mounting a device, thereby enabling an area for mounting the device to be secured.

Next, a smear of the surface of the insulating layer 130 is removed by performing a desmear process.

That is, after the insulating layer 130 is inflated, the inflated insulating layer 130 is removed using permanganate, and the smear is removed through a wet process for neutralizing the surface of the insulating layer 130.

Roughness may be provided on the surface of the insulating layer 130 through the desmear process.

Figure 6:
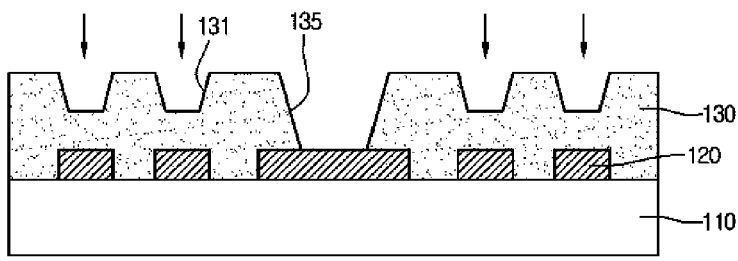

Next, as shown in FIG. 6, the metal layer 140 is formed on the insulating layer 130.

The metal layer 140 may be formed by an electroless plating method.

The electroless plating method may be conducted in the order of a degreasing process, a soft corrosion process, a spare catalyst treatment process, a catalyst treatment process, an activating process, an electroless plating process and a treatment process for preventing oxidation. Also, the metal layer 140 may be formed by sputtering metal particles using plasma.

The metal layer 140 is formed of an alloy including Cu, Ni, Pd or Cr

Figure 7:
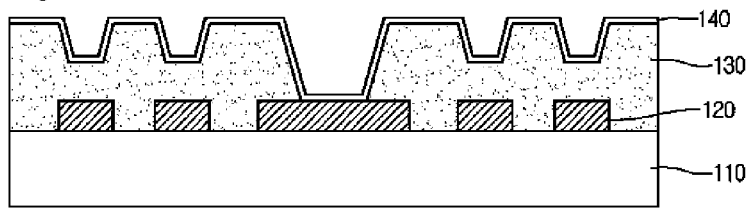

Next, as shown in FIG. 7, a plated layer 155 is formed by electrolytic plating the metal layer 140 as the seed layer with a conductive material.

The plated layer 155 may be formed by electrolytic plating the metal layer 140 as the seed layer. The plating may be performed at the same time as controlling currents depending on a plating area.

The plated layer 155 may be formed of Cu having high conductivity.

Figure 8:
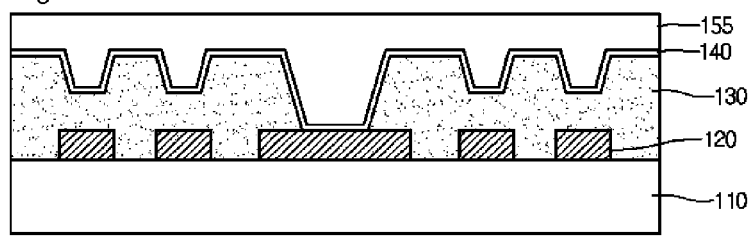

Next, as shown in FIG. 8, to remove the plated layer 155 from the insulating layer 130, a chemical and physical grinding process is performed.

That is, referring to FIG. 8, the printed circuit board 100 is disposed on a plate 310, and the plated layer 155, which is excessively plated, is ground using a slurry, in which ammonia is contained as a main component and into which a small amount of hydrogen peroxide is added, at an alkali atmosphere of more than pH 9.

A grinder 320 rotates on the plate 310 and causes the slurry and the plated layer, which is excessively plated, to be physically etched.

Accordingly, like FIG. 2, by the chemical and physical etching process, the metal layer 155 is etched until the insulating layer 130 is exposed. The etching is completed without the plated layer 155 which remains on the insulating layer 130.

The plate 310 may have a diameter of less than 1300 mm, and may have a heating wire which is formed so that heat is transmitted to the printed circuit board 100. Accordingly, the printed circuit board 100 having a size of more than 510 and 410 mm in length and breadth may be simultaneously etched, thereby enabling the process for removing the plated layer 155 having a large area to be performed.

Figure 9:
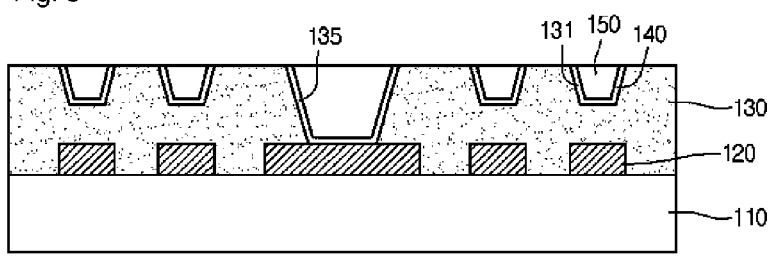
FIG. 9 and FIG. 10 are each graph and photo showing the effects of a printed circuit board according to the present invention.
Figure 9:
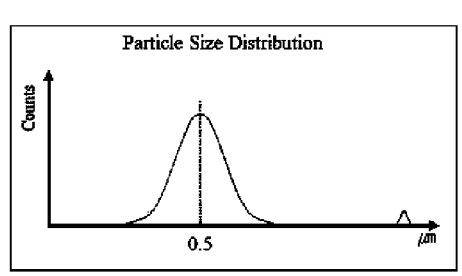
Figure 9:
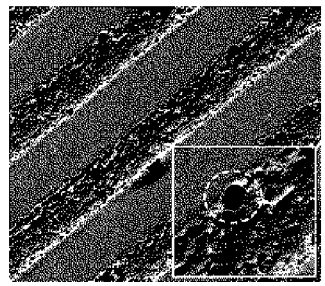
Figure 10:
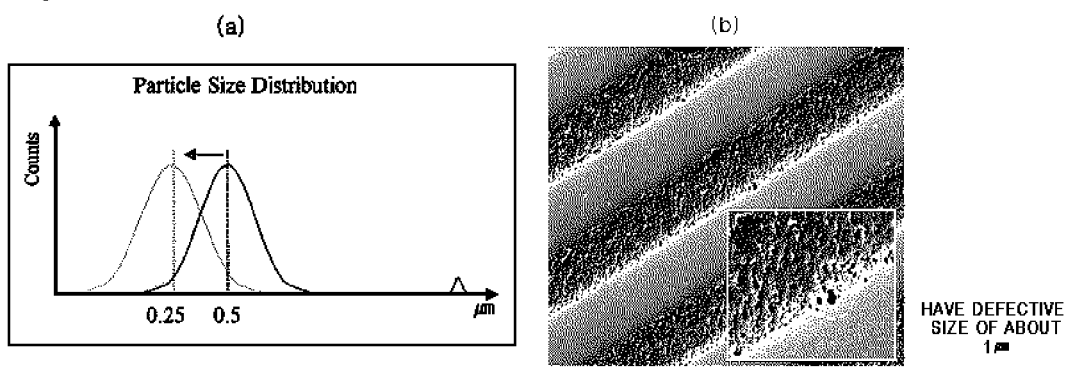

Referring to FIG. 9 and FIG. 10, in a case where the diameter h1 of the solid filler 137 has a distribution of about 0.5 μm, the solid filler 137, which remains in the surface of the insulating layer 130 at the time of removing the plated layer 150, is exposed and is separated, and thus a void of about 3 μm is observed at the surface as shown in FIG. 9b. In a case where the void is more than 3 μm, the defective product may be discarded.

At this time, as shown in FIG. 10a, in a case where the diameter of the solid filler 137 has a distribution of about 1.25 μm, the void generated by the separation of the solid filler 137 which remains in the surface of the insulating layer 130 at the time of removing the plated layer 155 has a size of less than 1 μm as shown in FIG. 10b.

Accordingly, since the void is beyond the defective range, a production rate may be improved.

Hereinafter, a printed circuit board according to another exemplary embodiment of the present invention will be explained with reference to FIG. 11.

Figure 11:
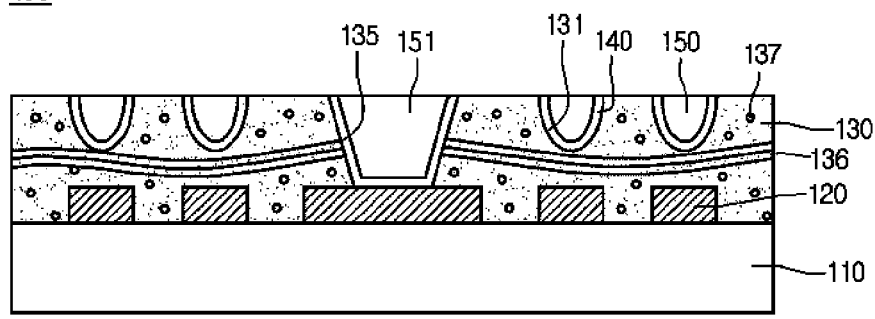
FIG. 11 is a cross-sectional view of a printed circuit board according to another exemplary embodiment of the present invention.

Referring to FIG. 11, a printed circuit board 400 includes: the insulating plate 110; the first circuit pattern 120 formed on the insulating plate 110; the insulating layer 130; and the plurality of second circuit patterns 150.

The insulating plate 110 may be a thermosetting or a thermoplastic polymer substrate, a ceramic substrate, an organic-inorganic composite material substrate, or a glass fiber-impregnated substrate. When the insulating plate 110 includes a polymer resin, it may include an epoxy insulating resin. Unlike this, the insulating plate 110 may also include a polyimide-based resin.

As a base circuit pattern, the plurality of first circuit patterns 120 are formed on the insulating plate 110.

The first circuit pattern 120 may be formed of a material having high electric conductivity and low resistance, and may be also formed by patterning a copper foil, which is a thin copper layer, as a conductive layer. When the first circuit pattern 120 is the copper foil layer, and the insulating plate 110 includes resins, the first circuit pattern 120 and the insulating plate 110 may be a normal copper clad laminate (CCL).

Meanwhile, the insulating layer 130 is formed on the insulating plate 110 to bury the first circuit pattern.

The insulating layer 130 may be formed in the plurality of insulating layers 130, and each insulating layer 130 may be a polymer resin and the like.

The insulating layer 130 may be configured such that the solid component 130a is impregnated in the resin material, and the resin material may include an epoxy resin or a polyimide-based resin.

The solid components 136, 137 may be reinforced fiber, glass fiber or the filler 137 and so on, and preferably, a mixture in which the glass fiber 136 and the filler 137 are mixed.

A size of the filler 137 of the solid components 136, 137 may be formed so that a diameter h1 satisfies less than 5% to a width of the circuit pattern 150. When a width of the second circuit pattern 150 is 3 to 25 µm, the filler 137 may have a width of 0.15 to 0.75 µm, preferably, 0.15 to 0.4 µm.

The insulating layer 130 includes: the via hole 135 to which the first circuit pattern is exposed; and the circuit pattern groove 131 for forming the plurality of second circuit patterns 150.

At this time, the circuit pattern groove 131 is formed so that a cross section thereof has a curved line. Preferably, the cross-section is formed to make a U shape.

The circuit pattern groove 131 may range from 3 to 25 µm in pattern width and 3 to 25 µm in pattern depth. Furthermore, an intaglio of the via hole 135 may satisfy about less than 80 µm in diameter, and may satisfy about less than 100 µm in depth.

In the inner part of the circuit pattern groove 131 and the plurality of via holes 135 of the insulating layer 130, the metal layer 140 is formed along the U shape of the circuit pattern groove 131.

The metal layer 140 is the seed layer. The metal layer may be formed of Cu, Ni or an alloy thereof.

The second circuit patterns 150 and the via 151 in which the circuit pattern groove 131 and the via holes 135 are buried, respectively, are formed on the metal layer 140.

The second circuit patterns 150 and the via 151 may be simultaneously formed, and may be formed of an alloy including at least one of Al, Cu, Ag, Pt, Ni and Pd, and by plating the metal layer 140 as the seed layer.

In the case of the printed circuit board 100 of FIG. 10, the circuit pattern groove 131 of the insulating layer 130 is formed in a curved shape, and the second circuit patterns 150 are formed by burying the circuit pattern groove 131 of the curved shape in a metal.

Like this, as the second circuit patterns 150 is formed in the curved shape without an edge, a signal noise generated when resistance is concentrated to the edge can be prevented, and an increase in heat generated from the edge can be reduced.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

The invention claimed is:

1. A printed circuit board, comprising:
an insulating substrate that includes a resin material in which a solid component is impregnated, and has a plurality of circuit pattern grooves formed on an upper surface thereof;
a plurality of buried circuit patterns that are formed to bury the circuit pattern grooves; and
a metal layer disposed along the circuit pattern groove;
wherein the solid component includes a glass fiber and an inorganic filler,
wherein a diameter of the inorganic filler is in a range of from 0.15 µm to 0.25 µm, and
wherein a void generated by separation of the inorganic filler that remains at a surface of the insulating substrate has a size of less than 1 µm.

2. The printed circuit board of claim 1, wherein the insulating substrate comprises: an insulating plate, a base circuit pattern which is patterned on the insulating plate; and an insulating layer which is formed on the insulating plate to cover the base circuit pattern, wherein the circuit pattern groove is formed on a surface of the insulating layer.

3. The printed circuit board of claim 2, wherein the insulating layer comprises a via hole to which the base circuit pattern is exposed.

4. The printed circuit board of claim 3, further comprising a via in which the via hole is buried.

5. The printed circuit board of claim 1, wherein the circuit pattern groove and the buried circuit patterns are formed in a U-like shape.

6. The printed circuit board of claim 1, wherein the metal layer is formed in a U-like shape.

7. The printed circuit board of claim 2, wherein the resin material includes epoxy resin or polyimide resin.

8. The printed circuit board of claim 2, wherein the inorganic filler is $SiO_2$ or $Al_2O_3$.

* * * * *